United States Patent [19]

Yamazaki et al.

[11] Patent Number: 4,875,378
[45] Date of Patent: Oct. 24, 1989

[54] PRESSURE SENSOR WITH A FERROELECTRIC LIQUID CRYSTAL LAYER

[75] Inventors: Shunpei Yamazaki, Tokyo; Akira Mase, Atsugi, both of Japan

[73] Assignee: Semiconductor Energy Laboratory Co., Ltd., Kanagawa, Japan

[21] Appl. No.: 150,150

[22] Filed: Jan. 29, 1988

[30] Foreign Application Priority Data

Feb. 19, 1987 [JP] Japan .................................. 62-37566

[51] Int. Cl.$^4$ .......................... G01L 5/16; G01L 1/16; H01L 41/18
[52] U.S. Cl. ................. 73/862.04; 73/862.68; 73/DIG. 4; 310/338
[58] Field of Search ............... 340/365 A; 310/338, 310/800, 311, 366, 339; 350/333, 350 R, 350 S; 73/862.04

[56] References Cited

U.S. PATENT DOCUMENTS

| | | | |
|---|---|---|---|
| 3,991,606 | 11/1976 | Dreyer | 73/606 |
| 4,234,813 | 11/1980 | Iguchi et al. | 310/800 |
| 4,367,924 | 11/1983 | Clark et al. | 350/350 S |
| 4,703,305 | 10/1987 | Ayliffe | 350/350 S |

Primary Examiner—Joseph A. Orsino
Assistant Examiner—Hollis T. Chen
Attorney, Agent, or Firm—Gerald J. Ferguson, Jr.

[57] ABSTRACT

A new type of pressure sensor is disclosed here. The sensor is composed of a pair of glass substrates and a ferroelectric liquid crystal which is interposed between the substrates and exhibits piezoelectric effect. Because of crystalline property in liquid phase, the piezoelectric medium can be easily disposed and aligned between the substrates in light of the orientation of the surface contiguous to the liquid crystal layer.

6 Claims, 5 Drawing Sheets

PRESSURE SENSOR WITH A FERROELECTRIC LIQUID CRYSTAL LAYER

BACKGROUND OF THE INVENTION

This invention relates to a pressure sensor, and more particularly, to a pressure sensor embodying a ferroelectric liquid crystal material.

In general, most pressure sensors for use at the present are composed of a piezoelectric crystalline layer interposed between parallel electrodes, from which an electric signal is generated in response to the pressure applied on the piezoelectric crystalline layer. Ferroelectric materials such as barium titanate, lead titanate, lead zirconate and so on are used for example.

Since the processes using such inorganic materials require high temperatures, the production apparatuses are expensive. Also, it is difficult to obtain a large bulk of such a piezoelectric crystal, while arrays collectively composed of small elements, although well-known in the area, bring difficulties in production.

Furthermore, most of such piezoelectric crystals used for existing pressure sensors have to be so thick as to exhibit sufficient piezoelectric effect so that the sensors are hardly transparent. Because of this, they are not suitable for application to touch panels of a computer main frame.

SUMMARY OF THE INVENTION

It is therefore an object of the invention to provide pressure sensors which can be manufactured at low cost.

It is another object of the present invention to provide pressure sensors which can be used as a transparent member overlying an indicator lamp.

BRIEF DESCRIPTION OF THE INVENTION

FIG. 1 is a plan view showing one glass substrate for a pressure sensor in accordance with the present invention.

FIGS. 2(A) and 2(B) are a perspective view and a cross sectional view showing an embodiment of the present invention.

FIGS. 3(A), 3(B) and 3(C) are graphical diagrams showing the pressure applied on an element of a matrix constituting the pressure sensor in accordance with the present invention and the voltages generated in response to the pressure at that element and the adjacent element.

FIGS. 4(A) and 4(B) are graphical diagrams showing the diverse pressures applied to a certain element and the piezoelectric voltage generated at the element in response thereto.

FIG. 5 is a block diagram showing a driving circuit for pressure sensor in accordance with present invention.

DETAILED DESCRIPTION OF THE PREFERRED EMBODIMENTS

Figure 1:
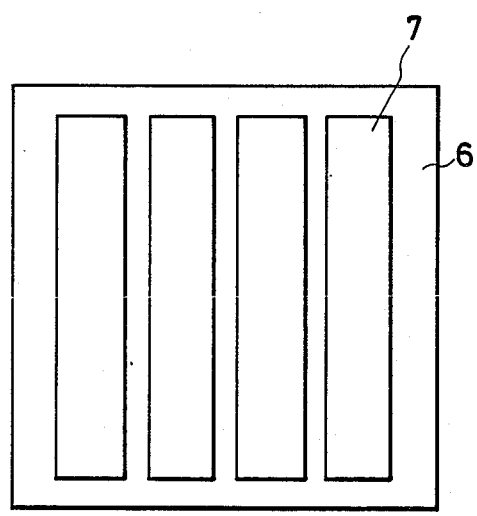

Referring to FIGS. 1 and 2, an embodiment of the present invention is illustrated. An ITO film is deposited with 2000 Å or 1500 Å in thickness on a glass substrate 6 by DC sputtering and treated by photolithography to produce a pattern including a plurality of conductive strips 7 as shown in FIG. 1. The glass substrate 6 is 1.1 mm thick or thinner, and has an area of A4 (200 mm×300 mm). Then, a polyimide film is formed on the substrate over the ITO pattern, fired at 250° C. in an atmosphere of nitrogen or hydrogen and given rubbing treatment using a cotton cloth having piles about 2 mm long to produce an orientation control surface.

Figure 2A:
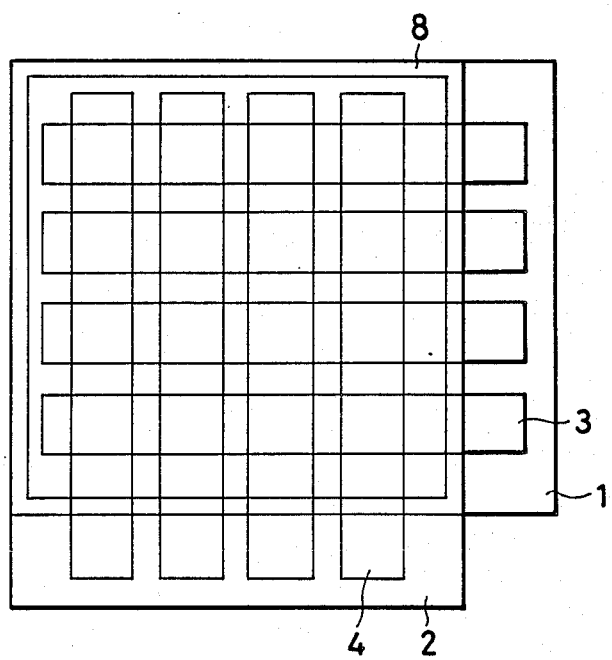
Figure 2B:
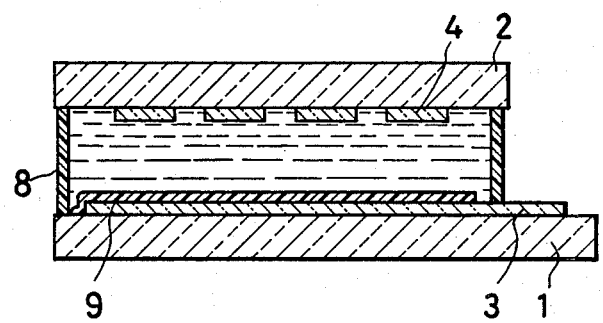

Two substrates are treated by this way, as shown in FIGS. 2A and 2B, to prepare a first substrate 1 and a second substrate 2 for pressure sensor as illustrated in FIG. 2(B). On the inside surface of one substrate is scattered "Toss Pearl", the trademark of a spacer composed of particles having 2 microns in diameter, Toray Industries Inc. The dispersion is such that on the average is one particle per 100 square microns. To the perimeter of the surface of the other substrate is applied an adhesive 8 of epoxy resin by screen press printing. The pair of substrates are mated with their ITO patterns opposing to each other with an interval of 1 to 10 micron, preferably 1.5 to 2.5 micron, e.g., 2.5 microns and heated to cure the adhesive 8. The patterns of the both substrates 1 and 2 are arranged in orthgonal relation to coordinate a matrix structure. In this process, the space between the substrate 1 and 2 is not entirely confined by the adhesive 8, but there remains an access through which the inside space can be filled with a ferroelectric liquid crystal 5. The liquid crystal is selected out of materials having a high Ps, e.g., DOBAMBC. In general, chiral smectic liquid crystals are suitable. After filling, the access is closed with an adhesive, preferably the same adhesive as aforesaid. The sensor thus produced is substantially transparent so that it can be overlaid on an indicator lamp which indicates the "on" state by transmitting light through the sensor. This manufacturing process as illustrated hereinbefore can be implemented at temperatures not higher than 250° C. Because of the expansion of illustration in FIG. 2(B) in the vertical direction, the sealing adhesive 8 appears as a very thin wall. In reality, however, the adhesive sealing has 2 mm in width with respect to the lateral direction.

Figure 3A:
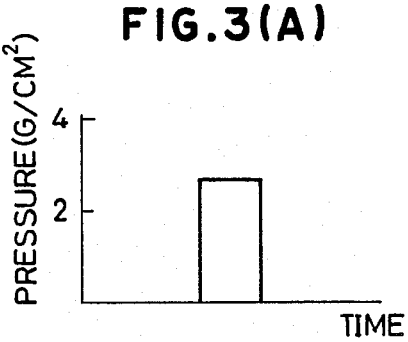
Figure 3B:
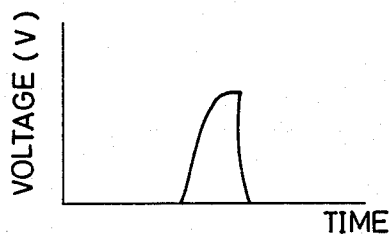
Figure 3C:
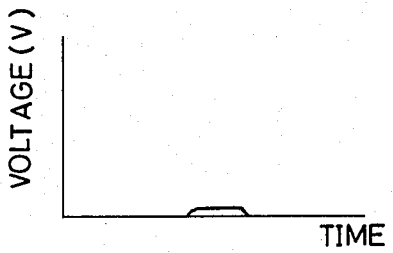

When a touch on one element of the sensor, for example with a finger, produces a pressure on the ferroelectric liquid crystal layer 10 as illustrated in FIG. 3(A), an output voltage appears across the corresponding opposed conductive strips as illustrated in FIG. 3(B). The touched element can be identified in the correspondence with the opposed strips. While the voltage is generated at the particular element, the adjacent element to that element on the matrix is subjected to only a negligible voltage as shown in FIG. 3(C).

Figure 4A:
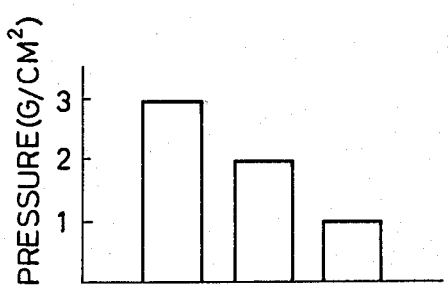
Figure 4B:
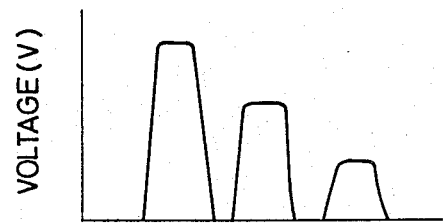

FIGS. 4(A) and (B) are graphical diagrams showing the relation between the pressure on an element and the magnitude of the generated voltage in response thereto. From these diagrams, it will be easily understood that the present invention can be applied not only for detecting the identification of the pressed element but also for detecting the magnitude of the pressure.

Figure 5:
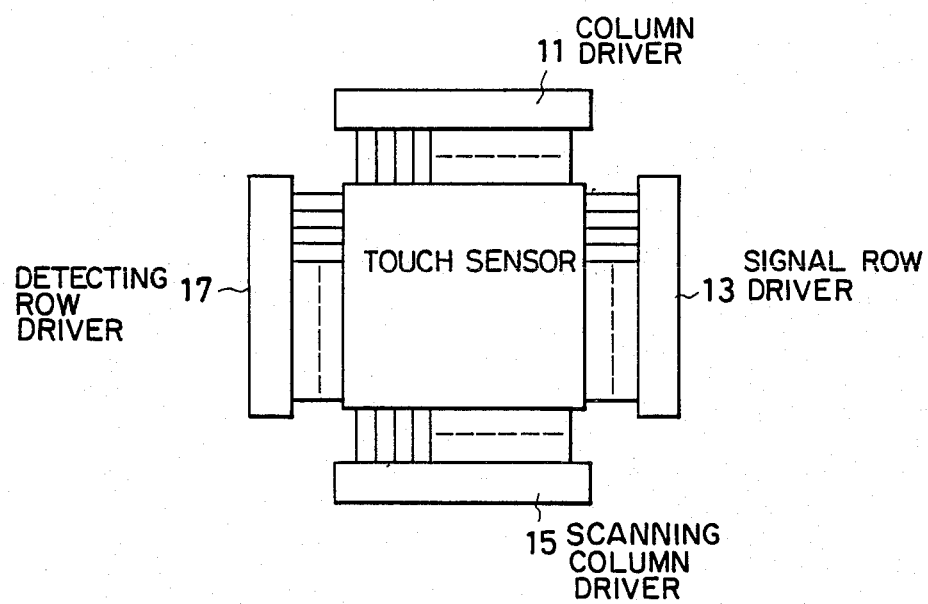

Next, one example of the driving system for this sensor will be described with reference to FIG. 5. The pressure sensor is provided with an addressing column driver 11 and a signal row driver 13. By means of the first addressing and signal line drivers 11 and 13, the pressure sensor can display in the same way as a conventional liquid crystal device. The pressure sensor is further provided with a scanning column driver 15 and a detecting row driver 17. All the elements of the pressure sensor are scanned and detected the voltage generated between particular opposed strips by means of the scanning column driver 15 and the detecting row driver 17.

For example, one second may be divided into 31 periods. Out of the 31 periods, 30 periods are imparted to 30 frames for displaying letters or other visual information, during which the addressing column driver 11 and the signal row driver 13 operate. The other one period is imparted to pressure detection during which the scanning column driver 15 and the detecting row driver 17 operate.

While a description has been made for several embodiments, the present invention should be limited only by the appended claims and should not be limited by the particular examples.

We claim:

1. A pressure sensor comprising:

a pair of substrates;

a ferroelectric liquid crystal layer interposed between the substrates;

an electrode arrangement formed on the substrates and including at least one pair of electrodes located on the both sides of said liquid crystal layer to pick up the voltage generated across said liquid crystal layer; and a means for detecting the voltage induced between said pair of electrodes, said voltage being induced by piezoelectric effect by piezoelectric effect.

2. A pressure sensor comprising:

a pair of substrates;

a ferroelectric liquid crystal layer interposed between said pair of substrates;

a plurality of column electrodes and one or more row electrode arranged on the opposed insides of said substrates in a matrix form; and a detecting means connected with said column and row electrodes for detecting the piezoelectric voltage produced between particular column and row electrodes.

3. The sensor of claim 2 further comprising a driver means connected with said column and row electrodes for causing the display of a visual information in terms of the optical property of the liquid crystal.

4. The sensor of claim 3 wherein said liquid crystal layer is composed of at least a chiral smectic liquid crystal.

5. The sensor of claim 4 wherein at least one inside of said substrates is provided with an orientation control surface.

6. The sensor of claim 5 wherein said orientation control surface is produced by rubbing treatment.

* * * * *